(12) United States Patent (10) Patent No.: US 10,948,409 B2
Setija et al. (45) Date of Patent: Mar. 16, 2021

(54) METHOD AND APPARATUS FOR CALCULATING ELECTROMAGNETIC SCATTERING PROPERTIES OF FINITE PERIODIC STRUCTURES

(71) Applicant: ASML Netherlands B.V., Veldhoven (NL)

(72) Inventors: Irwan Dani Setija, Utrecht (NL); Petrus Maria Van Den Berg, The Hague (NL)

(73) Assignee: ASML Netherlands B.V., Veldhoven (NL)

(*) Notice: Subject to any disclaimer, the term of this patent is extended or adjusted under 35 U.S.C. 154(b) by 693 days.

(21) Appl. No.: 15/644,072

(22) Filed: Jul. 7, 2017

(65) Prior Publication Data

US 2018/0011014 A1 Jan. 11, 2018

(30) Foreign Application Priority Data

Jul. 7, 2016 (EP) .................................... 16178422

(51) Int. Cl.
*G01N 21/47* (2006.01)
*G03F 7/20* (2006.01)

(52) U.S. Cl.
CPC ......... *G01N 21/4788* (2013.01); *G03F 7/705* (2013.01); *G03F 7/70625* (2013.01); *G01N 2201/12* (2013.01)

(58) Field of Classification Search
CPC ........... G01N 21/4788; G01N 2201/12; G01N 21/9501; G01N 21/95607; G03F 7/705;
(Continued)

(56) References Cited

U.S. PATENT DOCUMENTS 8,731,882 B2 5/2014 Van Beurden
2004/0169861 A1* 9/2004 Mieher ............... G03F 7/70625
356/400
(Continued)

FOREIGN PATENT DOCUMENTS

WO WO 2015/032586 A1 3/2015

OTHER PUBLICATIONS

NIST, Metrology Topics, https://www.nist.gov/topics/metrology, 2016, accessed Jun. 5, 2020.*
(Continued)

*Primary Examiner* — Catherine T. Rastovski
(74) *Attorney, Agent, or Firm* — Sterne, Kessler, Goldstein & Fox P.L.L.C.

(57) ABSTRACT

A method of determining electromagnetic scattering properties of a finite periodic structure has the steps: 1002: Calculating a single-cell contrast current density, within a unit-cell supporting domain of a single one of a finite collection of unit cells. 1004: Calculating a scattered electric field outside the finite collection of unit cells, by integrating, over the single unit cell's supporting domain, a Green's function with the determined single-cell contrast current density. 1006: The Green's function is obtained for observation points outside the finite collection of unit cells by summation across the finite collection of unit cells. The Green's function integrated with the determined single-cell contrast current density is obtained for observation points above the supporting domain with respect to a substrate underlying the finite periodic structure. 1008: Determining an electromagnetic scattering property, for example a diffraction pattern, of the finite periodic structure using the calculated scattered electric field.

10 Claims, 9 Drawing Sheets

(58) Field of Classification Search
 CPC ............. G03F 7/70625; G03F 7/70133; G03F 9/7053; G03F 9/7084
 See application file for complete search history.

(56) References Cited

U.S. PATENT DOCUMENTS

| | | |
|---|---|---|
| 2013/0066597 A1* | 3/2013 | Van Beurden ............ G03F 1/84 703/1 |
| 2013/0135136 A1* | 5/2013 | Haynes ................... G01S 7/412 342/22 |
| 2013/0144560 A1 | 6/2013 | Pisarenco et al. |
| 2014/0222380 A1 | 8/2014 | Kuznetsov et al. |

OTHER PUBLICATIONS

International Search Report and Written Opinion of the International Searching Authority directed to related International Patent Application No. PCT/EP2017/064754, dated Sep. 4, 2017; 10 pages.

Felsen et al. "Radiation and Scattering of Waves," IEEE Press Series on Electromagnetic Wave Theory, Section 2.1-2.7; 56 pages.

* cited by examiner

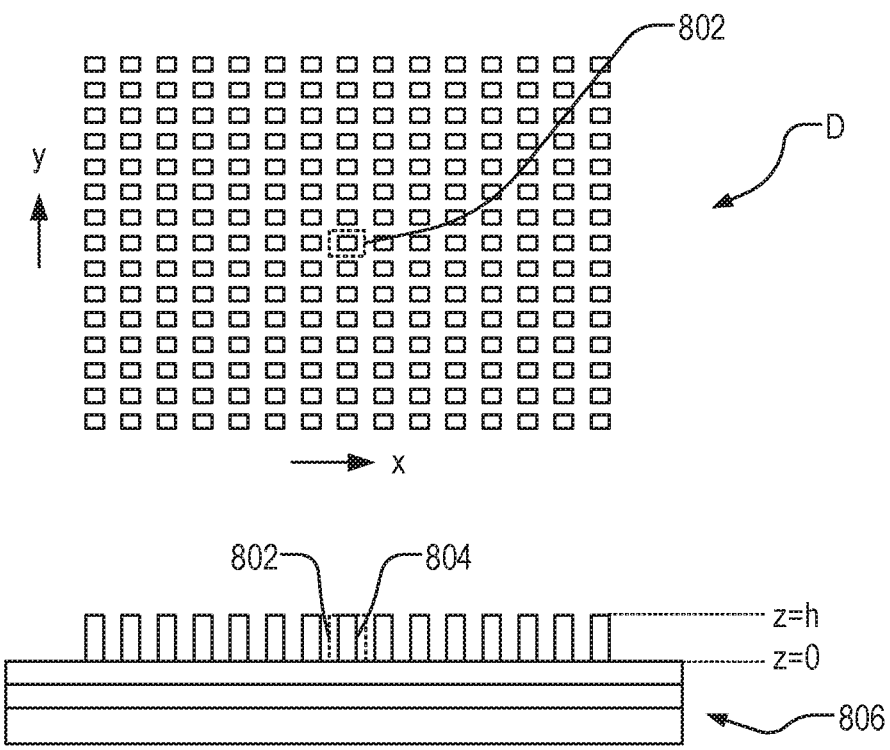
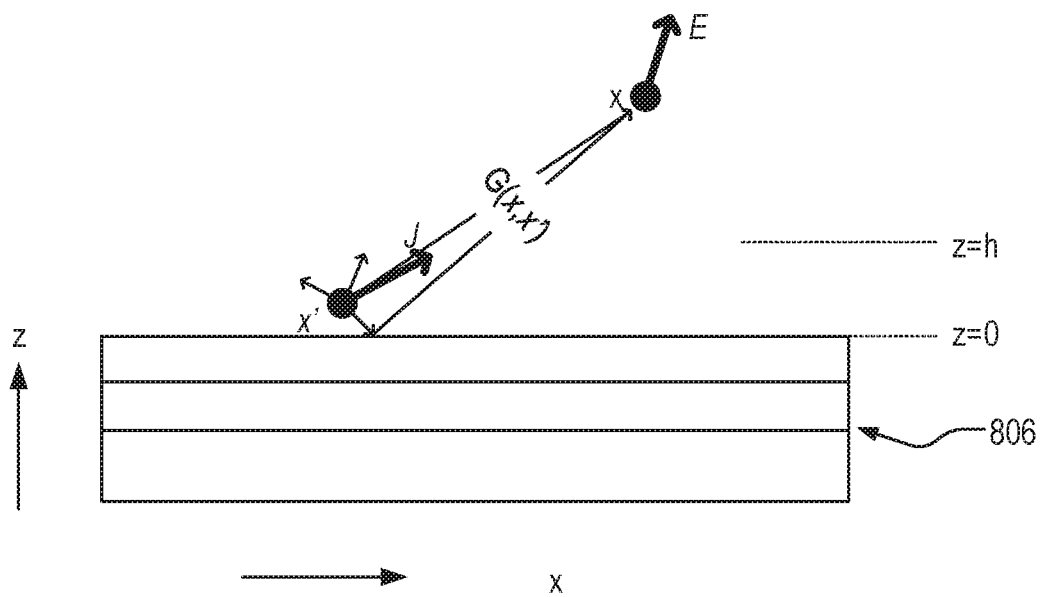
Fig. 8
Fig. 9

METHOD AND APPARATUS FOR CALCULATING ELECTROMAGNETIC SCATTERING PROPERTIES OF FINITE PERIODIC STRUCTURES

FIELD

The present invention relates to methods and inspection apparatus for determining electromagnetic scattering properties of finite periodic structures and reconstructing an approximate structure of such finite periodic structures. The present invention is usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

The reconstruction of critical dimension (CD) parameters in conventional angular scatterometers is based on computing the angular resolved diffraction spectrum from a grating profile and comparison to the measured spectrum.

Conventional metrology targets for CD-reconstruction are typically 40×40 $\mu m^2$ large. With a 25 $\mu m$ spot to illuminate the grating, it is well in the regime where the grating can be modeled as an infinitely periodic grating. This greatly simplifies the computation since only the solution over a single unit cell needs to be found. However, it is desirable to achieve CD-reconstruction on small in-die targets (5×5 $\mu m^2$) or even on-product structures that might not be periodic. For a finite, non-periodic grating, the solution over the whole grating must now be found which increases the computational load with the ratio of grating surface to unit cell. This prohibits fast inline reconstruction or generation of libraries.

Thus, it is important to construct an approximation of the diffraction spectrum from a finite, non-periodic metrology target or product structure. In conventional approaches, other approximations have been used: (1) an approximation where the finite structure is embedded in a much larger unit cell and (2) the windowed approximation where the scattered field from an infinitely periodic grating is weighed with a rectangular function with the size of the grating. The first method leads to a huge increase in numerical complexity since the fundamental frequency of the spatial spectrum is determined by the size of the unit cell, so many more harmonics must be included to come to an accurate answer. The second method cuts off the scattered field at the edges of the grating much sharper than is realistic. This leads to strong ringing, i.e. interference fringes at the edge of the grating.

SUMMARY

The inventors have devised a method that enables an efficient approximation to compute diffraction from finite, non-periodic gratings, in at least one embodiment by using the solution from an infinitely periodic grating. It enables reconstruction of small metrology targets or even on-product structures without an increase of computational load.

According to a first aspect of the present invention, there is provided a method of determining electromagnetic scattering properties of a finite periodic structure, the finite periodic structure comprising a finite collection of unit cells periodically distributed across the finite periodic structure and defining its supporting domain, wherein each unit cell comprises at least one contrasting object defining a unit-cell supporting domain, the method comprising the steps:

(a) numerically calculating a single-cell contrast current density within a unit-cell supporting domain of a single unit cell of the finite collection of unit cells;

(b) numerically calculating a scattered electric field outside the finite collection of unit cells, arising from the finite periodic structure by integrating, over the single unit cell's supporting domain, a Green's function with the determined single-cell contrast current density, wherein the Green's function is obtained for observation points outside the finite collection of unit cells by summation across the finite collection of unit cells; and (c) determining an electromagnetic scattering property of the finite periodic structure using the numerically calculated scattered electric field.

According to a second aspect of the present invention, there is provided a method of reconstructing an approximate structure of a finite periodic structure from a detected electromagnetic scattering property arising from illumination of the finite periodic structure by radiation, the method comprising the steps:

estimating at least one structural parameter;

determining at least one model electromagnetic scattering property from the at least one structural parameter;

comparing the detected electromagnetic scattering property to the at least one model electromagnetic scattering property; and determining an approximate structure of the finite periodic structure based on the result of the comparison, wherein the model electromagnetic scattering property is calculated using a method according to the first aspect.

According to a third aspect of the present invention, there is provided an inspection apparatus comprising:

an illumination system configured to illuminate a finite periodic structure with radiation;

a detection system configured to detect an electromagnetic scattering property arising from the illumination:

a processor configured to:

estimate at least one structural parameter;

determine at least one model electromagnetic scattering property from the at least one structural parameter;

compare the detected electromagnetic scattering property to the at least one model electromagnetic scattering property; and determine an approximate structure of the finite periodic structure from a difference between the detected electromagnetic scattering property and the at least one model electromagnetic scattering property, wherein the processor is configured to determine the model electromagnetic scattering property using a method according to the first aspect.

According to a fourth aspect of the present invention, there is provided a computer program product containing one or more sequences of machine-readable instructions for calculating electromagnetic scattering properties of a structure, the instructions being adapted to cause one or more processors to perform a method according to the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 8 illustrates cross sections of a finite grating.

FIG. 9 illustrates a dipole that radiates in all directions and the electric field strength at an observation point obtained from the dyadic Green function.

Figure 1:
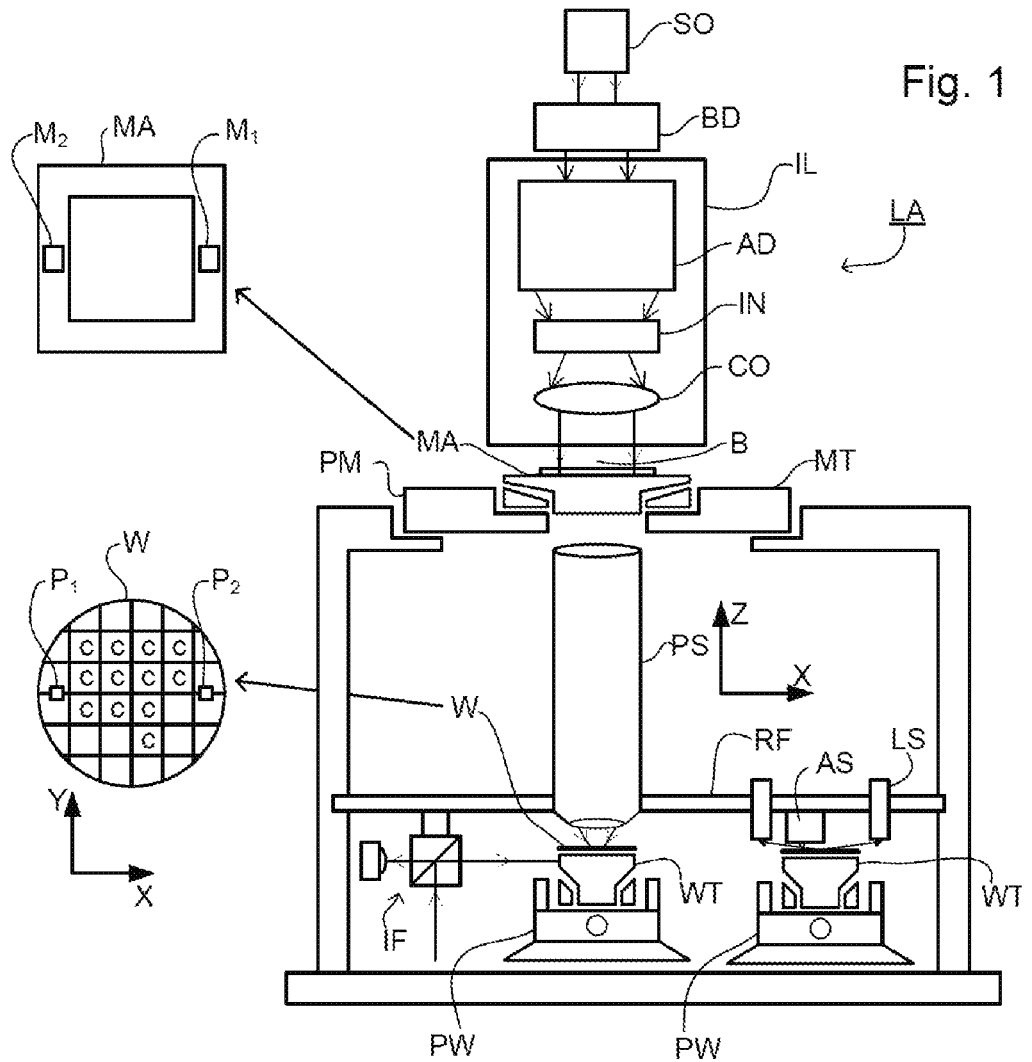
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 7A:
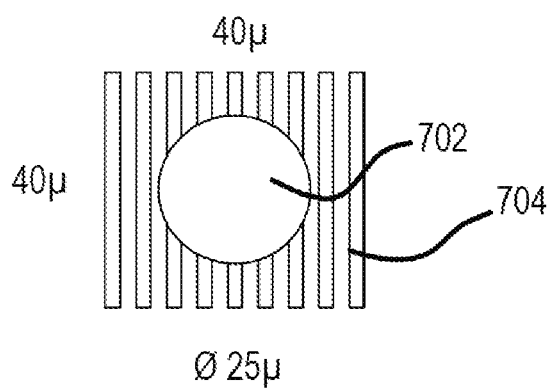
FIG. 7(a) illustrates a scatterometer spot size smaller than the target grating, an "underfill".

The angularly-resolved scatterometric principle is based on profile reconstruction from an angularly-resolved scattering spectrum. With reference to FIG. 7(a), a focused incoherent beam 702 is scattered from a target grating 704 that is larger than the illumination spot 702. This is called "underfill". The target profile is then reconstructed by comparing the measured spectrum to a computed spectrum from a parameterized profile. In the typical implementation of spectrum calculation, the complex reflection coefficients from the grating are computed using a rigorous diffraction model with periodic boundary conditions, for example Rigorous Coupled-Wave Analysis (RCWA). This has a computational advantage: due to the periodicity, the solution to Maxwell's equations only needs to be found in one period. This allows all fields and refractive index variations to be efficiently discretized by way of Fourier series. The fact that the illumination profile is not periodic, can be overcome by describing the focused beam as an infinite sum of incoherent plane waves. For each plane wave, the diffraction problem is solved and the reflected waves are incoherently added.

An important condition for the application of periodic boundary conditions is that the light does not "see" the edges of the grating. For a 25 μm diameter spot on a 40×40 μm2 grating, this condition is well fulfilled.

Figure 7B:
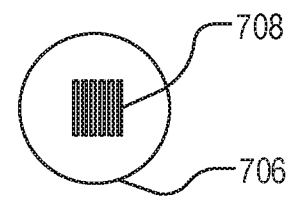
FIG. 7(b) illustrates a scatterometer spot size larger than the target grating, an "overfill".

Typical CD-reconstruction and overlay measurement in angularly resolved scatterometers takes place on such 40×40 μm2 metrology targets placed in the scribe lane. The trend in Wafer Metrology, however, is towards measurement of CD and overlay (OV) on small in-die targets ~10×10 μm2 and it is expected that CD reconstruction in the near future will also take place on such small gratings. For incoherent illumination it is difficult to reduce the spot to a size much smaller than 10 μm. For these sizes, the infinitely periodic grating assumption is invalid and the finite size of the grating must be taken into account. With reference to FIG. 7(b), a focused incoherent beam 706 is scattered from a target grating 708 that is smaller than the illumination spot 706. This is called "overfill". This leads to the illumination spot partly overlapping the metrology target boundaries. For CD reconstruction, this will lead to edge diffraction effects.

Before describing embodiments of the invention in detail, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system PS, also referred to herein as PL) configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned (e.g., by alignment sensor AS and lever sensor at reference frame RF) using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
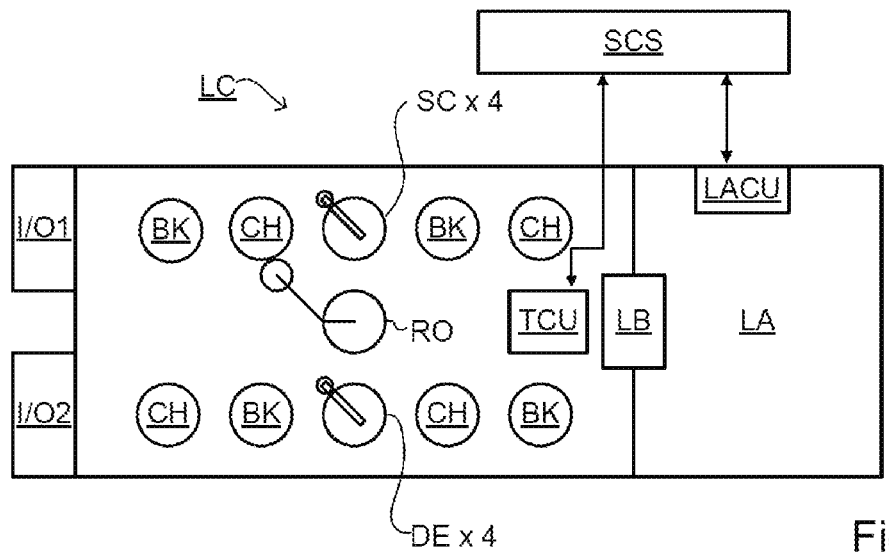
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
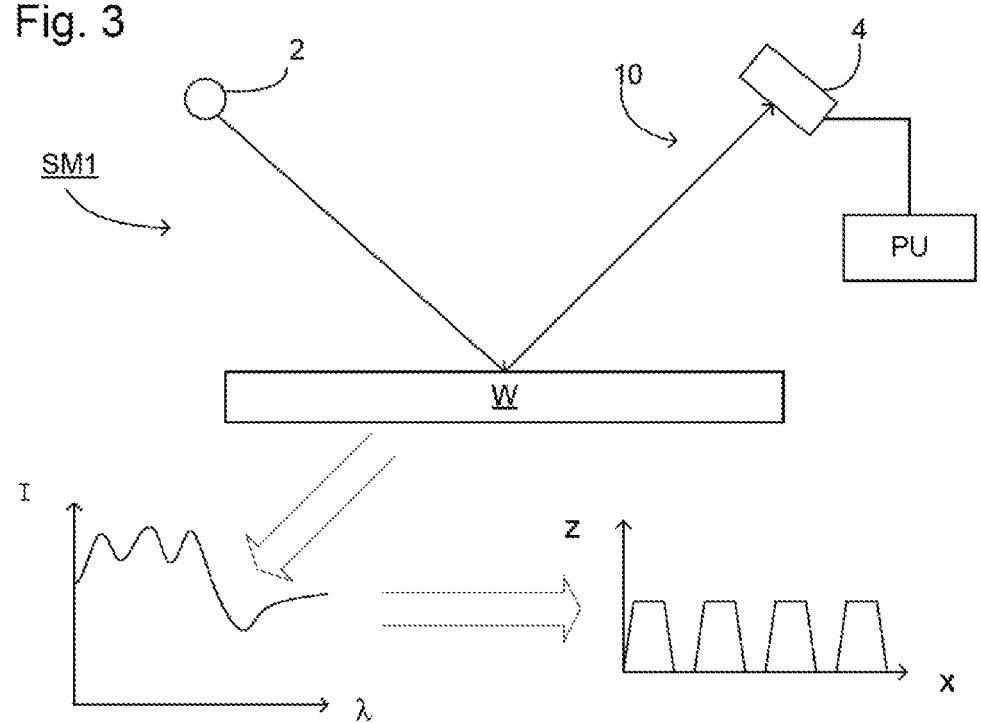
FIG. 3 depicts a first spectroscopic scatterometer.

FIG. 3 depicts a known scatterometer (SM1). It comprises a broadband (white light) radiation projector 2 which projects radiation onto a substrate W. The reflected radiation is passed to a spectrometer detector 4, which measures a spectrum 10 (intensity I as a function of wavelength λ) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
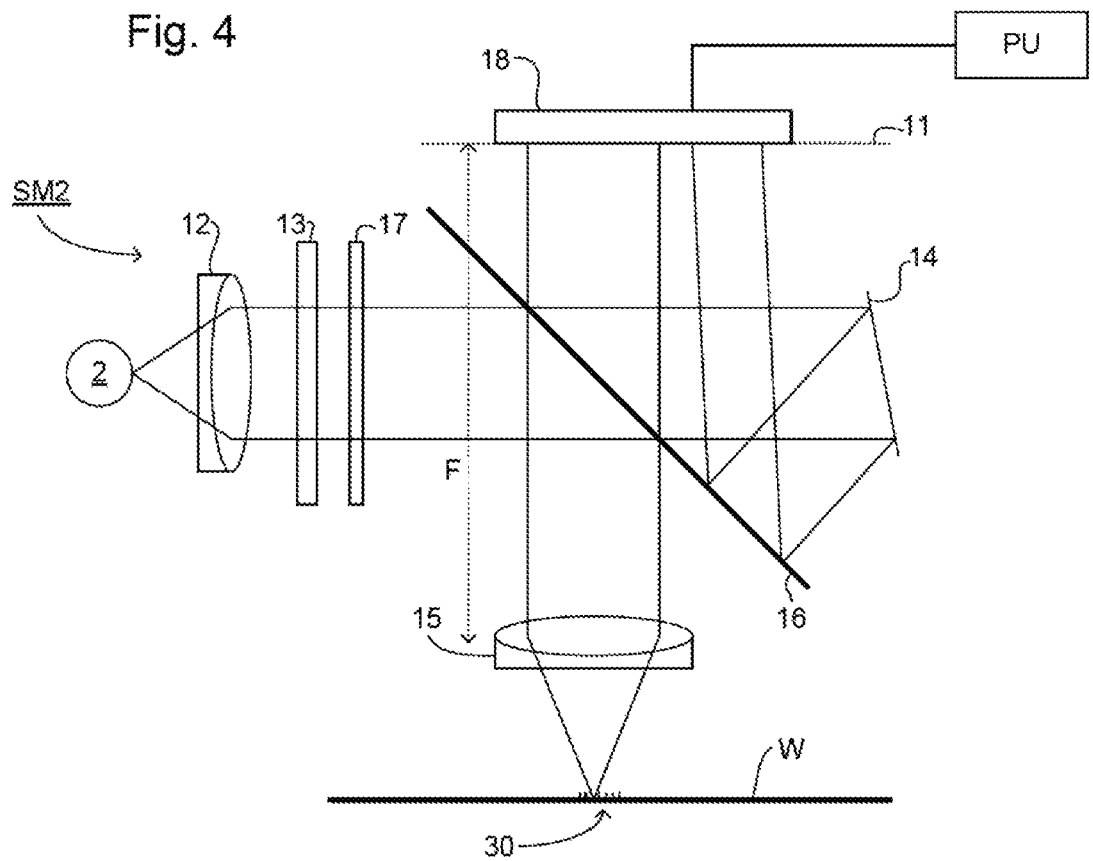
FIG. 4 depicts a second angular resolved scatterometer.

Another scatterometer (SM2) that may be used with an embodiment of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length F of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the target can be performed in a number of ways. In a first type of process, represented by FIG. 5, a diffraction pattern based on a first estimate of the target structure (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
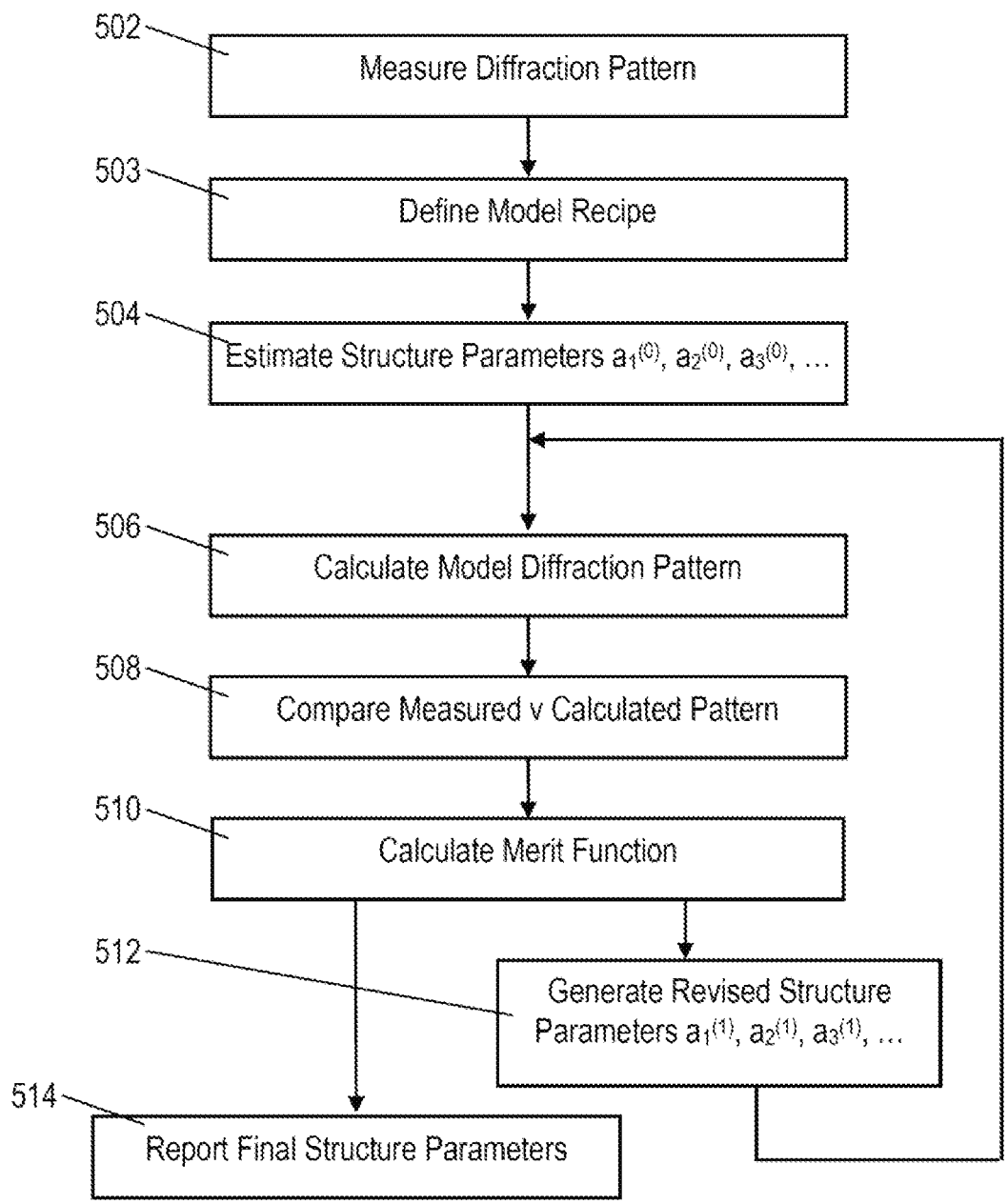
FIG. 5 depicts a first example process for reconstruction of a structure from scatterometer measurements.

Referring to FIG. 5 in more detail, the way the measurement of the target shape and/or material properties is carried out will be described in summary. The target will be assumed for this description to be periodic in only 1 direction (1-D structure). In practice it may be periodic in 2 directions (2-dimensional structure), and the processing will be adapted accordingly.

In step 502: The diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503: A 'model recipe' is established which defines a parameterized model of the target structure in terms of a number of parameters ai (a1, a2, a3 and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters pi.

In step 504: A model target structure is estimated by setting initial values ai(0) for the floating parameters (i.e. a1(0), a2(0), a3(0) and so on). Each floating parameter will be generated within certain predetermined ranges, as defined in the recipe.

In step 506: The parameters representing the estimated target structure, including shape together with the optical properties of the different elements of the model, are used to calculate the scattering properties, for example using a rigorous optical diffraction method such as RCWA or any other solver of Maxwell equations. This gives an estimated or model diffraction pattern of the estimated target structure.

In steps 508, 510: The measured diffraction pattern and the model diffraction pattern are then compared and their similarities and differences are used to calculate a "merit function" for the model target structure.

In step 512: Assuming that the merit function indicates that the model needs to be improved before it represents accurately the actual target structure, new parameters a1(1), a2(1), a3(1), etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514: When the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
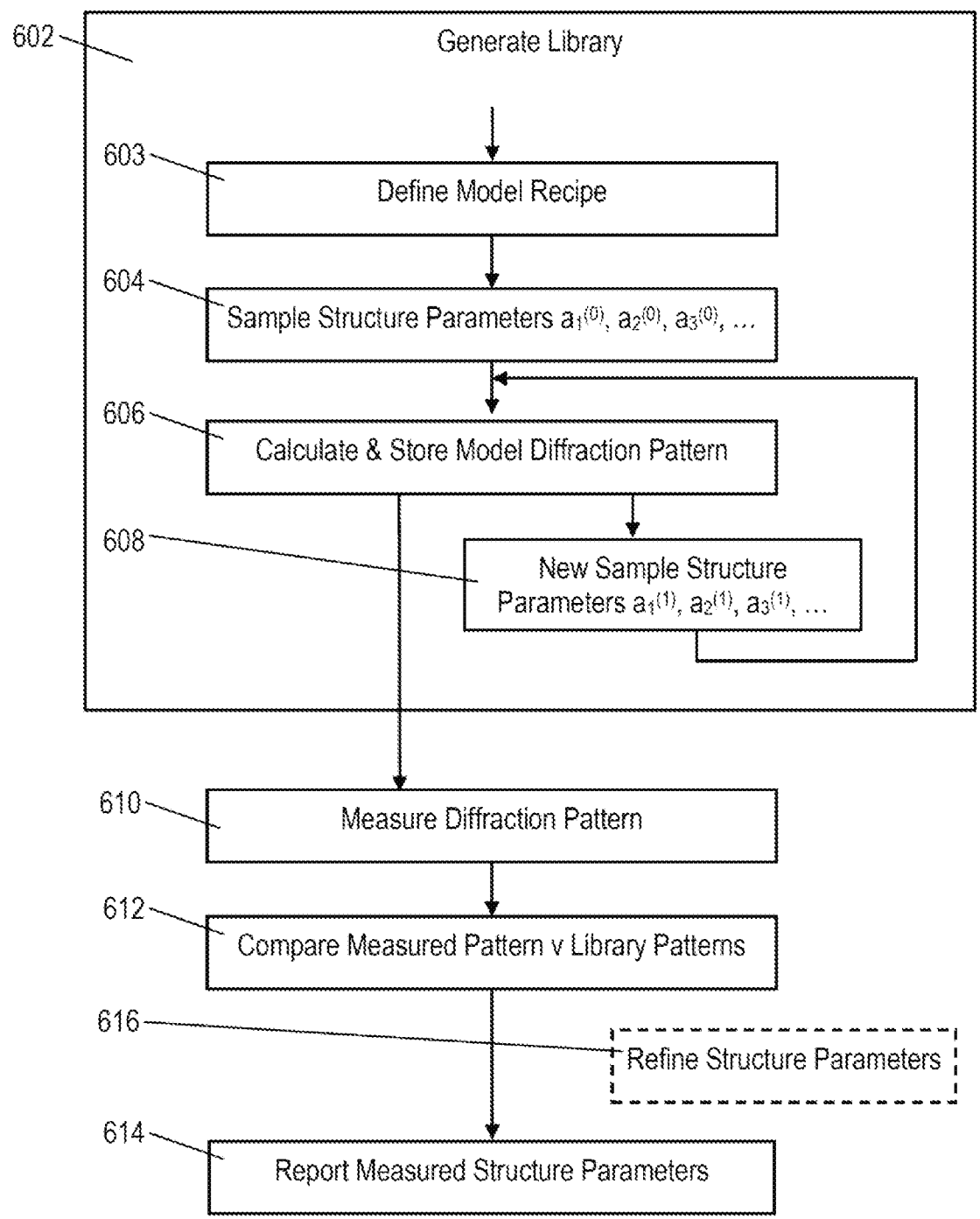
FIG. 6 depicts a second example process for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602: The process of generating the library begins. A separate library may be generated for each type of target structure. The library may be generated by a user of the measurement apparatus according to need, or may be pre-generated by a supplier of the apparatus.

In step 603: A 'model recipe' is established which defines a parameterized model of the target structure in terms of a number of parameters ai (a1, a2, a3 and so on). Considerations are similar to those in step 503 of the iterative process.

In step 604: A first set of parameters a1(0), a2(0), a3(0), etc. is generated, for example by generating random values of all the parameters, each within its expected range of values.

In step 606: A model diffraction pattern is calculated and stored in a library, representing the diffraction pattern expected from a target structure represented by the parameters.

In step 608: A new set of structure parameters a1(1), a2(1), a3(1), etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610: After the library is generated (though it could be before), the real target 30 is placed in the scatterometer and its diffraction pattern is measured.

In step 612: The measured pattern is compared with the modeled patterns stored in the library to find the best matching pattern. The comparison may be made with every sample in the library, or a more systematic searching strategy may be employed, to reduce computational burden.

In step 614: If a match is found then the estimated target structure used to generate the matching library pattern can be determined to be the approximate object structure. The structure parameters corresponding to the matching sample are output as the measured structure parameters. The matching process may be performed directly on the model diffraction signals, or it may be performed on substitute models which are optimized for fast evaluation.

In step 616: Optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e. the calculation of the estimated model diffraction pattern using a rigorous optical diffraction theory from the estimated target structure.

The method disclosed herein constructs a good approximation of the diffraction spectrum from a finite, non-periodic metrology target or product structure, in an embodiment by efficiently using the solution to an infinitely, periodic structure.

The single-cell contrast source expansion disclosed herein uses the periodic solution and transforms it to a contrast source, i.e. an effective current that leads to a scattered field. This current is distributed within the structure, for example a resist line, and is zero outside. By repeating this solution over a finite number of resist lines, each with the correct phase, one can effectively mimic scattering from a finite number of resist lines. At the edges of the grating, diffuse scattering is also modeled, however, from a periodic contrast source and not the real edge contrast source. This leads to residual errors. These errors are, however, much smaller than is made by the conventional windowed approximation. Furthermore, the error can be reduced by removing the outer pupil edge from the reconstruction.

Mathematical Formulation

We introduce a Cartesian coordinate system with horizontal coordinates x and y, and vertical coordinate z.

FIG. 8 illustrates a cross section of finite grating in the horizontal (x, y)-plane and in the vertical (x, z)-plane. The finite grating consists of a finite repetition in the horizontal x and y directions of a structure 804 defined in a single unit cell 802 spanning $0<z<h$.

The position in space is denoted by $x=\{x,y,z\}$. The complex representation of field quantities is used with time factor $\exp(-i\omega t)$, where i is imaginary unit and t denotes the time. The magnetic permeability of all media is equal to the vacuum permeability. For $z>h$ we have a vacuum halfspace, characterized by the electric permittivity, $\varepsilon_0$. We assume that the electromagnetic sources and receivers are located in this halfspace. In the substrate domain $z<0$ we have a horizontally layered medium, 806 in FIG. 8. The permittivity in the so-called embedding medium is only a function of the vertical coordinate and is denoted as $$\varepsilon(z)=\varepsilon_0, \text{ for } z>0, \tag{1}$$

$$\varepsilon(z)=\varepsilon_{substrate}(z), \text{ for } z<0, \tag{2}$$

In the domain $0<z<h$, a finite grating is present with (complex) permittivity $\varepsilon(x, y, z)$. Here, h is the maximum height of the grating. The supporting domain of this so-called contrasting object is denoted by D.

The field that is generated by electromagnetic sources in the embedding medium, without the presence of the contrasting object (finite grating), is denoted as the primary electromagnetic field, where the electric field strength is denoted as $E^{prm}=\{E_x^{prm}, E_y^{prm}, E_z^{prm}\}$, where the subscripts indicate the directions of its vector components. Its spatial dependence is denoted as $E^{prm}(x)=E^{prm}(x,y,z)$.

In a homogeneous domain, an electromagnetic source generates a continuous superposition of plane waves with horizontal wave numbers $k_x$ and $k_y$. At the top of the grating, $z=h$, the primary electric field with horizontal wave numbers $k_x=\alpha$ and $k_y=\beta$ may be written as $$E^{prm}(x,y,z)=E_0 \exp(i\alpha x+i\beta y), \tag{3}$$

where we have assumed that the electric field strength at position $x=\{0,0,h\}$ has unit amplitude $E_0$. The phase factor $\exp(i\alpha x+i\beta y)$ must be present in all electromagnetic field quantities.

In presence of the grating, the primary electromagnetic field is scattered both in the positive and negative z-direction. In the negative z-direction it is often called the transmitted field and in the positive z-direction it is denoted as the reflected field. Physically speaking, this scattered field is originated by electric current densities within the contrasting object (the grating). The electric currents densities depend not only on the primary fields quantities, but depend on the total field present inside the grating and on the permittivity, $\varepsilon_{sct}(x)$. Let us denote these contrast current density in the layer $0<z<h$ as $J=J(x)$ and we define $$J(x)=\chi(x)E(x), \text{ with } \chi(x)=\varepsilon_{sct}(x)/\varepsilon_0-1, \tag{4}$$

where E is the electric field strength in the grating domain and χ is the permittivity contrast. Note that this contrast function vanishes outside the grating domain. The contrast currents are only confined to the grating domain. They can be envisaged as the sources that generate a so-called scattered electromagnetic wave field in the whole space. This scattered electric field strength, Esct, is defined as $$E^{sct}=E-E^{prm}. \tag{5}$$

As stated before, this scattered field is generated by the contrast current, J, of Eq. (4) located in the embedding layered medium, where its permittivity is given by Eqs. (1)-(2). The electromagnetic solution of this type of electromagnetic wave field problems are well-known, e.g. L. B. Felsen and N. Marcuvitz, "Radiation and Scattering of Waves", Prentice-Hall, Inc., Englewood Cliffs, N.J., USA., Section 2.2-2.4. FIG. 9 illustrates a dipole with current density, J, present at position x' in a layered medium that radiates in all directions and the electric field strength, E, at observation point x is obtained from the dyadic Green function as E=GJ.

The expression for the electric field strength generated by a dipole at position x'={x',y',z'} is formally written as $$E^{dipole}(x) = G(x-x', y-y', z, z') J^{dipole}(x'), \quad (6)$$

where G is a second-rank Green's tensor (3×3 matrix), often denoted as the dyadic Green's function. This Green function is the electric field strength at spatial position x generated by a dipole with unit current density. This dipole is located at x' (see FIG. 9). The shift invariance in the horizontal x and y coordinates is a direct consequence of the invariance of the embedding medium in the horizontal directions (see FIG. 9). Note that the embedding medium is the whole space from $-\infty < z < \infty$. The permittivity is given by Eqs. (1)-(2). Expressions for this dyadic Green function are analytically obtained in the spectral domain. Denoting $\tilde{G} = \tilde{G}(k_x, k_y, z)$ as the spectral dyadic Green function, its counterpart in the spatial domain is obtained through the 2D spatial Fourier inverse transform $$G(x, y, z, z') = \quad (7)$$
$$\frac{1}{(2\pi)^2} \int_{k_x=-\infty}^{\infty} \int_{k_y=-\infty}^{\infty} \exp(ik_x x + ik_y y) \tilde{G}(k_x, k_y, z, z') dk_x dk_y.$$

The scattered field at a point x consists of a superposition of all contributions of the dipole sources at all points x' distributed over the whole grating domain, D, where D is the collection of unit cells $D_{cell}$. Hence, the electric field strength of the scattered field is obtained as $$E^{sct}(x) = \sum_{all\ cells} \int_{x'} \int_{\in D} \int_{cell} G(x-x', y-y', z, z') J(x') dV. \quad (8)$$

This rigorous expression for the electric field strength is the starting point for the description of embodiments of the present invention. If the contrast current, J, can be determined numerically with sufficient accuracy, Eq. (8) provides the scattered electric field in the halfspace z>0. In the next section, we consider the case where the assumption is made that the grating has an infinite number of unit cells in the two horizontal directions, or in other words the case of a 2D periodic grating.

Assumption of Quasi-Periodicity of Electromagnetic Fields

The periodicity of the infinite grating in the two horizontal directions entails a quasi-periodicity in the electromagnetic field strengths. Since the primary field strength $\exp(-i\alpha x - i\beta y) E_r^{prm}$ is constant in the horizontal directions x and y, the quantities $\exp(-i\alpha x - i\beta y) E^{sct}$ and $\exp(-i\alpha x - i\beta y) J$ are periodic. The period $p_x$ in x is the width of the unit cell in the x-direction, while the period $p_y$ in y is the width of the unit cell in the y-direction.

In view of this quasi-periodicity, the contrast current density exhibits the following property:

$$J(x+np_x, y+mp_y, z) = \exp(i\alpha np_x + i\beta mp_y) J(x,y,z), \quad (9)$$

for $n=-\infty, \ldots, \infty$ and $m=-\infty, \ldots, \infty$. This relation shows that the current density $J(x+np_x, y+mp_y, z)$, in a unit cell with ordinal numbers n and m, is direct related to the current density $J(x,y,z)$ of the central unit cell n=m=0. Interchanging integration and summation in Eq. (8), while using the quasi-periodicity rule of Eq. (9), we obtain the scattered field in the central unit cell as $$E^{sct}(x) = \int_{x'} \int_{\in D} \int_{cell} G^{quasiprd}(x-x', y-y', z, z') J(x') dV, \quad (10)$$

for $x \in D_{cell}$, where we now denote $D_{cell}$ as supporting domain of the central unit cell. The quasi-periodic dyadic Green function, $G^{quasiprd}$, is related to the non-periodic G as $$G^{quasiprd}(x, y, z, z') = \quad (11)$$
$$\sum_{n=-\infty}^{\infty} \sum_{m=-\infty}^{\infty} \exp(i\alpha np_x + i\beta mp_y) G(x+np_x, y+mp_y, z, z').$$

This quasi-periodic dyadic Green function represents the electric field strength from a periodic set op dipoles with electric current density, J. The right-hand side of Eq. (11) can be rewritten in many ways, dependent on the nature of the problem, e.g., by using the 2D form of the Poisson summation formula.

It is noted that the spatial spectrum of the quasi-periodic Green function, $G^{quasiprd}$, is discrete, while the non-periodic one, G, has a continuous spectrum.

Once the contrast current density in a single periodic unit cell is determined, the scattered field is obtained from Eq. (10). In principle, the contrast current density may be determined from a domain integral equation over the unit cell. This equation is obtained from Eq. (10) and Eq. (5). Multiplying the resulting equation by the contrast function $\chi(x)$ and using $J=\chi E$, the integral equation is obtained as $$J(x) = \chi(x) E^{prm}(x) + \quad (12)$$
$$\chi(x) \int_{x'} \int_{\in D} \int_{cell} G^{quasiprd}(x-x', y-y', z, z') J(x') dV,$$

with for $x=(x,y,z) \in D_{cell}$, and $0<z<h$. This integral equation, for the unknown J in a unit cell, exhibits a convolutional type of operator with respect to the horizontal coordinates, which is efficiently implemented in a computer code with a Fast Fourier Transform method (FFT). The major advantage of the periodicity of the integral equation is the confinement to one unit cell, restricting the solution space of the unknown contrast current density to one unit cell.

In the method disclosed in U.S. Pat. No. 8,731,882B2, which document is hereby incorporated by reference in its entirety, the integral equation is transformed to the discrete spectral domain exhibiting excellent efficiency and convergence properties.

However, on one hand, the extension of this method to model finite-sized gratings is computer intensive and, on the other hand, the assumption that the finite grating may be replaced by an infinite grating does not provide sufficient accuracy for small structures.

In the next section we describe how to handle the rigorous scattered field expression of Eq. (8) for the finite-grating case, and how to exploit the efficient solution of the integral equation of Eq. (10) for the periodic grating.

Assumption of Similarity of Contrast Current Densities in Unit Cells

In this section, it is assumed that the finite grating indeed consists of a finite number of unit cells. Now, it cannot be assumed that the electromagnetic field quantities exhibit a quasi-periodicity, but we only assume that the contrast current density has a similarity in each unit cell.

Without loss of generality, we consider the finite grating with an odd numbers 2N+1 and 2M+1 of unit cells in the x- and y-directions, respectively. Let we denote the contrast current density in the central unit cell as $J(x)=J(x,y,z)$. Further, let the current density in a unit cell with ordinal numbers n and m be denoted as $J(x+np_x, y+mp_y, z)$. Then, it is assumed that the following similarity relation holds $$J(x+np_x, y+mp_y, z) = \exp(i\alpha np_x + i\beta mp_y) J(x,y,z), \quad (13)$$

for n=–N, ..., 0, ..., N and m=–M, ..., 0, ..., M. This is where the approximation comes in. This similarity relation does not hold at the grating edges. Since the number of unit cells is finite, it means that these contrast currents are quasi-periodic over a finite number of unit cells only. Since, in mathematical terms, periodicity is related to an infinite structure, we denote Eq. (13) as the similarity relation for the contrast current density.

In principle, the relation of Eq. (13) is satisfied when we replace the contrast currents in each unit cell by the weighted mean over all unit cells of the finite grating, viz., $$J(x, y, z) = \frac{1}{(2N+1)(2M+1)} \quad (14)$$

$$\sum_{n=-N}^{N} \sum_{m=-M}^{M} \exp(-i\alpha np_x - i\beta mp_y) J(x + np_x, y + mp_y, z).$$

It is remarked that these mean values of the contrast currents are still functions of position x in each unit cell and include the mean value of the edge effects of the finite grating. The mean values of the edge effects decrease for increasing number of unit cells and the quasi-periodic constituent increases.

Interchanging integration and summation in Eq. (8) while using the similarity relation of Eq. (13), we obtain the scattered field as $$E^{sct}(x) \approx \int_{x'} \int_{\in D} \int_{cell} G^{finite}(x-x', y-y', z, z') J(x') dV. \quad (15)$$

The integration is over the central unit cell, and the dyadic Green function, $G^{finite}$, is obtained as $$G^{finite}(x, y, z, z') = \quad (16)$$

$$\sum_{n=-N}^{N} \sum_{m=-M}^{M} \exp(i\alpha np_x + i\beta mp_y) G(x + np_x, y + mp_y, z, z').$$

Note that the spatial spectrum of this Green function is not discrete anymore, but it is in fact continuous. A finite summation of a continuous function remains continuous. This means that the scattered-field spectrum is not discrete, but continuous as well. In contrary to the scattering from the infinitely periodic grating in discrete orders, in the finite grating case, one deals with a "diffusive" scattered field.

At this point, the actual contrast current density, J, in the representation for the scattered field is not known. Above we described the infinite-grating case, where the integral equation of Eq. (12) is derived by requiring consistency with the integral equation of Eq. (10). In a similar way, for the finite-grating case, one may require consistency as well. The finite-grating integral equation consistent with the integral representation of Eq. (15) is the following one:

$$J(x) \approx \quad (17)$$

$$\chi(x) E^{prm}(x) + \chi(x) \int_{x'} \int_{\in D} \int_{cell} G^{finite}(x-x', y-y', z, z') J(x') dV,$$

where $x \in D_{cell}$ and $G^{finite}$ is given in Eq. (16). Apart from the dyadic Green function, the integral equation is similar, to the one for the quasi-periodic case, and in principle, one can compute its solution with similar computational tools. Both type of integral equations have the same support, viz., the central unit cell.

For the two limiting cases, (a) a configuration with a single unit cell, and (b) a configuration with infinite number of unit cells, the scattered field representation of Eq. (15) and the integral equation of Eq. (17) provides rigorous solutions.

For gratings of finite number of unit cells, in a first embodiment, the integral equation of Eq. (17) is solved numerically with tools similar to the ones for numerical solution of the infinite grating. The computation time of the finite Green function of Eq. (15) is computer intensive, but does not depend on the grating profile and may be computed and stored in a preprocessing step.

In a second embodiment, the efficient solution of the integral equation of Eq. (12) of the infinite grating is exploited: the contrast current density computed for points located in the central unit cell of the infinite grating computer code is substituted in the scattered field representation of Eq. (15). Then, using FFT routines, the scattered electric field strength at a horizontal plane in the upper halfspace z>h can be computed efficiently by taking advantage of the convolutional structure of $G^{finite}$. The finite summation of dyadic Green functions leads to the diffusive scattered field in all directions.

Computational Steps

In this section we outline the computational steps to be performed in two embodiments of a method of determining electromagnetic scattering properties of a finite periodic structure.

With reference to FIG. 8, the finite periodic structure comprises a finite collection, D, of unit cells 802 periodically distributed across the finite periodic structure and defining its supporting domain, D. Each unit cell comprises at least one contrasting object 804 defining a unit-cell supporting domain, $D_{cell}$.

Figure 10:
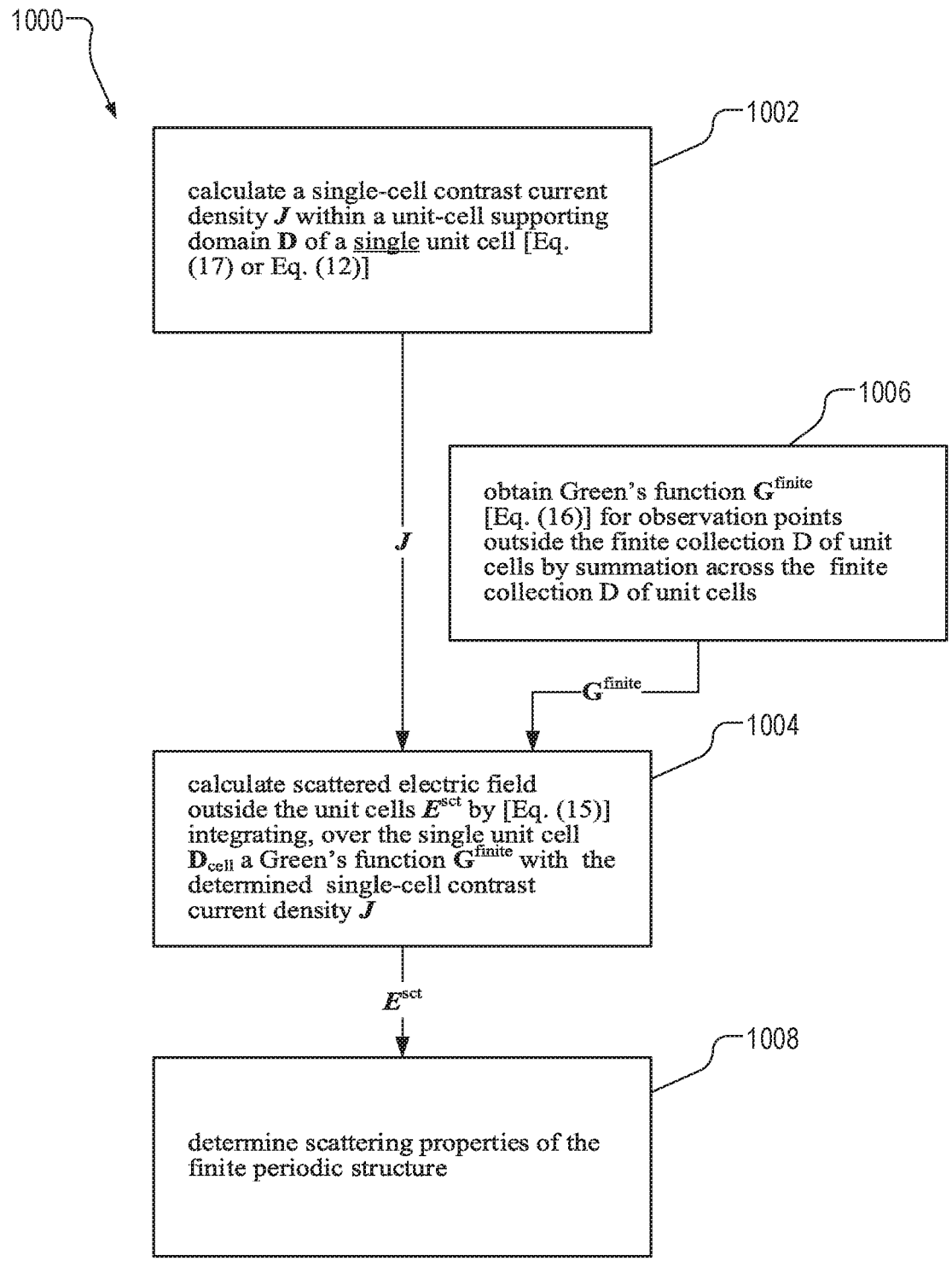
FIG. 10 is a flow chart of the steps according to an embodiment of the present invention.

With reference to FIG. 10, the method 1000 has the steps:

1002: Numerically calculating a single-cell contrast current density, J, within a unit-cell supporting domain, $D_{cell}$, of a single unit cell of the finite collection, D, of unit cells. The numerical calculation may be performed according to Eq. (17) in a first embodiment or Eq. (12) in a second embodiment.

Step 1002 is performed by solving an integral equation, over the single unit cell's supporting domain, $D_{cell}$, for the unknown single-cell contrast current density, J, with a kernel being a Green's function, $G^{finite}$ or $G^{quasiprd}$, obtained for observation points inside a supporting domain of a periodic structure comprising a plurality of the unit cells.

In a first embodiment, the plurality of unit cells is the finite collection, D, of unit cells and the kernel Green's function, $G^{finite}$, is obtained, according to Eq. (16), by summation across the finite collection, D, of unit cells.

In a second embodiment, the plurality of unit cells is an infinite collection of the unit cells and the kernel Green's function, $G^{quasiprd}$, is obtained, according to Eq. (11), by summation across the infinite collection of unit cells. By using Fourier space, it is possible to sum over an infinite number of unit cells, which would not be practical in real space.

1004: Numerically calculating a scattered electric field, $E^{sct}$, outside the finite collection, D, of unit cells, arising from the finite periodic structure by (according to Eq. (15)) integrating, over the single unit cell's supporting domain, $D_{cell}$, a Green's function, $G^{finite}$, with the determined single-cell contrast current density, J.

1006: The Green's function is obtained according to Eq. (16) for observation points outside the finite collection, D, of unit cells by summation across the finite collection, D, of unit cells. The Green's function that is integrated with the determined single-cell contrast current density, J, is obtained for observation points above the supporting domain, D, with respect to a substrate underlying the finite periodic structure.

1008: Determining the electromagnetic scattering property, for example a diffraction pattern, of the finite periodic structure using the numerically calculated scattered electric field, $E^{sct}$.

Figure 11:
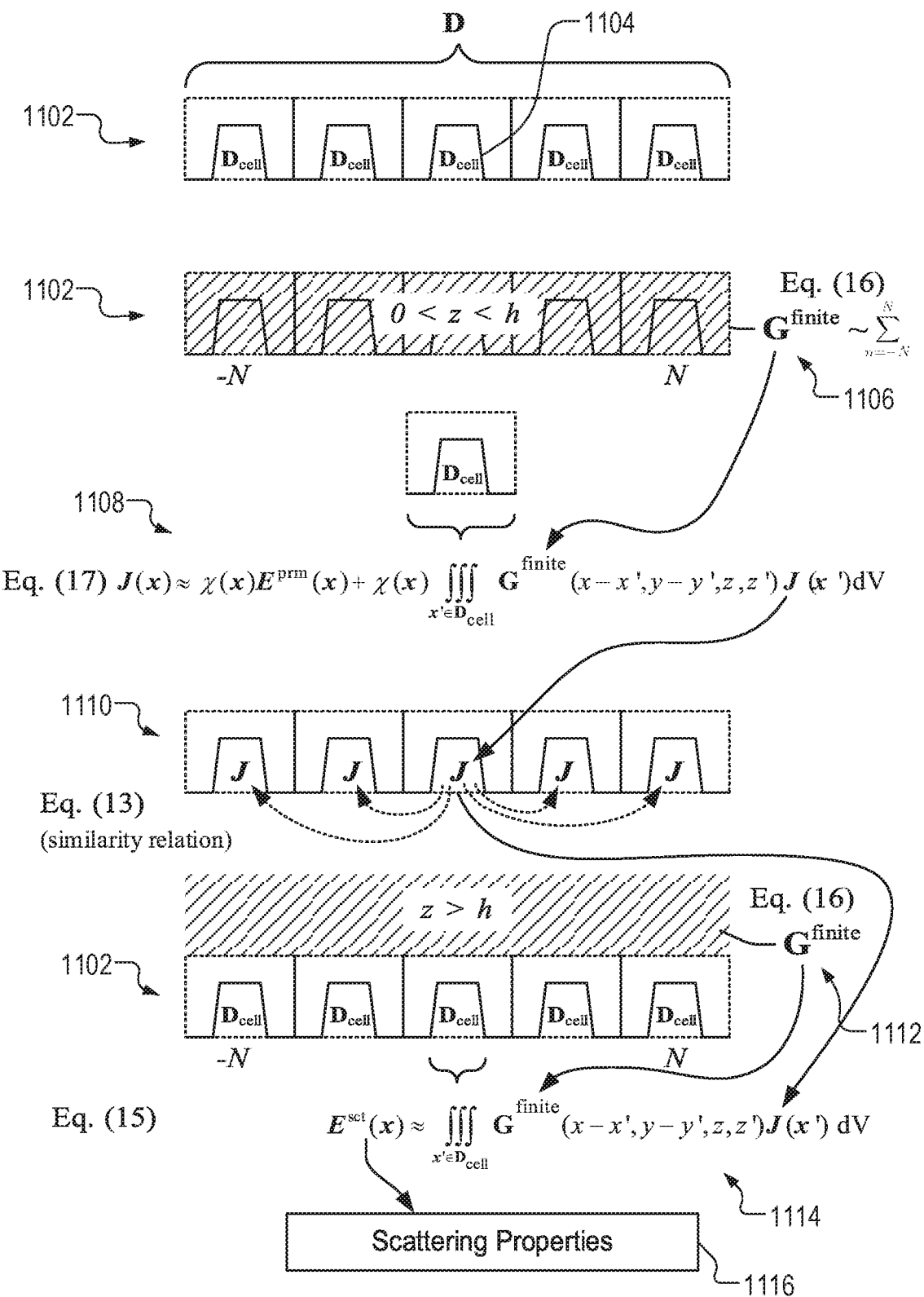
FIG. 11 illustrates schematically the flow of calculations according to a first embodiment of the present invention.

FIG. 11 illustrates schematically the flow of calculations in the first embodiment.

The finite periodic structure comprises a finite collection, D, of unit cells 1102 periodically distributed across the finite periodic structure and defining its supporting domain, D. Each unit cell comprises at least one contrasting object 1104 defining a unit-cell supporting domain, $D_{cell}$. The following steps are performed.

1106: Compute the Green's function $G^{finite}$ of Eq. (16) for observation points (illustrated by cross-hatching) inside the finite grating domain 1102 for 0<z<h. Since G is obtained as a Fourier transform of $\tilde{G}$, see Eq. (7), it is efficiently computed in the spectral domain. For this computation, the plurality of unit cells is the finite collection, D, of unit cells and the kernel Green's function $G^{finite}$ is obtained, according to Eq. (16), by summation across the finite collection, D, of unit cells 1102, −N . . . N, −M . . . M.

1108: Computing, by running computer code, the contrast current density, J, in a unit cell (optionally the central one) of the finite grating, either in the spatial domain or in the spectral domain, based on form of Eq. (17). This results in a value of contrast current density, J. Since the number of unit cells is finite, it means that the contrast currents are quasi-periodic over a finite number of unit cells 1110 only, as represented by the similarity relation Eq. (13). Alternatively, the contrast current density, J, may be obtained by calculating the electromagnetic field, E, in the unit cell of the finite grating, in a similar way to that described steps 1208 and 1210 with reference to FIG. 12 below.

1112: Compute the Green's function $G^{finite}$ of Eq. (16) for observations points (some of which are illustrated by cross-hatching) above the grating domain z>h. Since G is obtained as a Fourier transform of $\tilde{G}$, see Eq. (7), it is efficiently computed in the spectral domain. For this computation, the plurality of unit cells is the finite collection, D, of unit cells and the kernel Green's function $G^{finite}$ is obtained, according to Eq. (16), by summation across the finite collection, D, of unit cells 1102, −N . . . N, −M . . . M.

1114: Compute the scattered electric field, $E^{sct}$, in a horizontal plane above the grating with use of Eq. (15), either in the spatial domain or in the spectral domain.

1116: Determine electromagnetic scattering properties of the finite periodic structure using the numerically calculated scattered electric field, $E^{sct}$.

Figure 12:
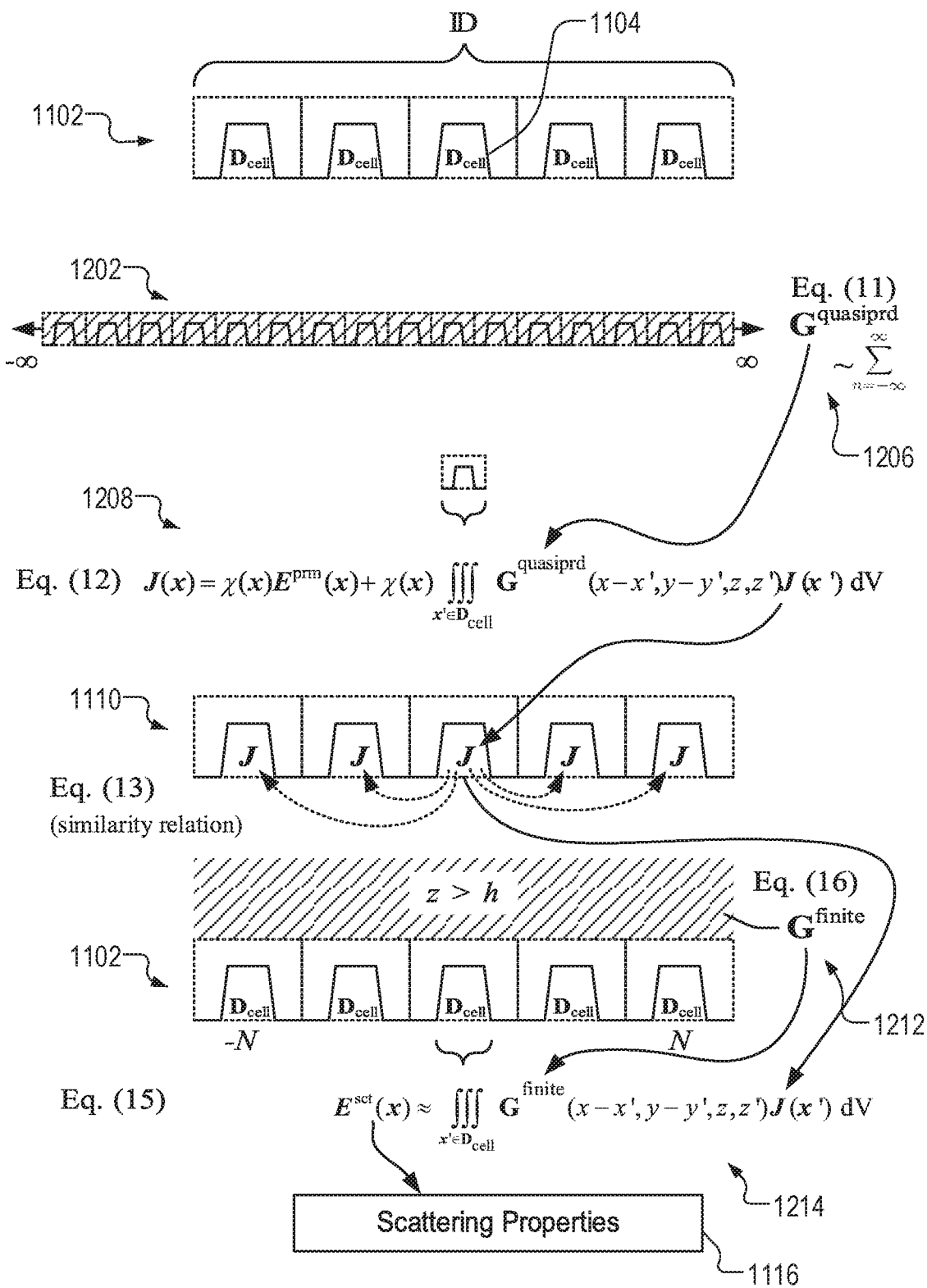
FIG. 12 illustrates schematically the flow of calculations according to a second embodiment of the present invention.

FIG. 12 illustrates schematically the flow of calculations in the second embodiment.

In the same way as for the first embodiment, the finite periodic structure comprises a finite collection, D, of unit cells 1102 periodically distributed across the finite periodic structure and defining its supporting domain, D. Each unit cell comprises at least one contrasting object 1104 defining a unit-cell supporting domain, $D_{cell}$. The following steps are performed.

1206: Compute the Green's function $G^{quasiprd}$ of Eq. (11) for observation points (illustrated by cross-hatching) inside the infinite grating domain 1202 for 0<z<h. Since G is obtained as a Fourier transform of $\tilde{G}$, see Eq. (7), it is efficiently computed in the spectral domain. For this computation, the plurality of unit cells is an infinite collection of the unit cells and the kernel Green's function $G^{quasiprd}$ is obtained, according to Eq. (11), by summation across the infinite collection of unit cells 1202, −∞ . . . ∞, −∞ . . . ∞.

1208: Computing, by running computer code, the electromagnetic field in a unit cell (optionally the central one) of the infinite grating, either in the spatial domain or in the spectral domain, e.g. using the method described in U.S. Pat. No. 8,731,882B2, based on the spectral form of Eq. (12).

1210: Assign the resulting contrast current density J in the central unit cell of the infinite grating to the contrast current density of the central unit of the finite grating. Since the number of unit cells is finite, it means that the contrast currents are quasi-periodic over a finite number of unit cells 1110 only, as represented by the similarity relation Eq. (13).

1212: In the same way as for the first embodiment, compute the Green function $G^{finite}$ of Eq. (16) for observation points above the grating domain z>h. Since G is obtained as a Fourier transform of G, see Eq. (7), it is efficiently computed in the spectral domain.

For this computation, the plurality of unit cells is the finite collection, D, of unit cells and the kernel Green's function $G^{finite}$ is obtained, according to Eq. (16), by summation across the finite collection, D, of unit cells 1102, −N . . . N, −M . . . M.

1214: Compute the scattered electric field in a horizontal plane above the grating with the use of Eq. (15), either in the spatial domain or in the spectral domain.

1216: Determine electromagnetic scattering properties of the finite periodic structure using the numerically calculated scattered electric field, $E^{sct}$.

The first embodiment has an advantage over the second because it is self-consistent, rather than assuming the grating is infinite.

Embodiments of the present invention may be used in methods of reconstructing an approximate structure of a finite periodic structure from a detected electromagnetic scattering property arising from illumination of the finite periodic structure by radiation. In accordance with the method described with reference to FIG. 5, the method has the steps:

504: Estimating at least one structural parameter.

506: Determining at least one model electromagnetic scattering property from the at least one structural parameter using any method as described with reference to FIGS. 10 to 12.

508: Comparing the detected electromagnetic scattering property to the at least one model electromagnetic scattering property.

510, 512: Determining an approximate structure of the finite periodic structure based on the result of the comparison.

In accordance with the method described with reference to FIG. 6, there may be a step of arranging 606, 608 a plurality of the model electromagnetic scattering properties in a library and the step of comparing comprises matching the detected electromagnetic scattering property to contents of the library.

Embodiments of the present invention provide a faster rigorous diffraction solver for non-periodic repeating structures, like gratings. They enable realtime CD reconstruction on finite gratings, as is conventionally performed for infinitely periodic structures, but with a correct modeling of edge diffraction effects at almost the same computational cost.

Embodiments of the present invention also allow the computation of an angular-resolved spectrum from an angularly resolved scatterometer target (underfill situation) at one run of the rigorous diffraction model. This has the advantage that extra spectrum sampling points can be added to the reconstruction at no extra computational cost.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The computer program may be executed on a processor, such as processing unit PU in the scatterometer.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method, for implementation in a lithography or metrology process, of determining electromagnetic scattering properties of a finite periodic structure on a target portion of a semiconductor substrate, the finite periodic structure comprising a finite collection of unit cells periodically distributed across the finite periodic structure and defining its supporting domain, wherein each unit cell comprises at least one contrasting object defining a unit-cell supporting domain, the method comprising:

determining a single-cell contrast current density within a unit-cell supporting domain of a single unit cell of the finite collection of unit cells of the finite periodic structure on the target portion of the semiconductor substrate;

determining a scattered electric field outside the finite collection of unit cells, arising from the finite periodic structure by integrating, over the single unit cell's supporting domain, a Green's function with the determined single-cell contrast current density, wherein the Green's function is obtained for observation points outside the finite collection of unit cells by summation across the finite collection of unit cells;

determining an electromagnetic scattering property of the finite periodic structure using the scattered electric field;

storing the determined electromagnetic scattering property for subsequent adjustment of a parameter of the lithography or metrology process for the semiconductor substrate or another semiconductor substrate; and transmitting the determined electromagnetic scattering property to a lithographic apparatus or a metrology tool in order to adjust the parameter and improve accuracy of the lithographic apparatus or the metrology tool.

2. The method of claim 1, wherein the determining a single-cell contrast current density is performed by solving an integral equation, over the single unit cell's supporting domain, for the unknown single-cell contrast current density with a kernel being a Green's function obtained for observation points inside a supporting domain of a periodic structure comprising a plurality of the unit cells.

3. The method of claim 2, wherein the plurality of the unit cells is the finite collection of unit cells and the kernel Green's function is obtained by summation across the finite collection of unit cells.

4. The method of claim 2, wherein the plurality of the unit cells is an infinite collection of the unit cells and the kernel Green's function is obtained by summation across the infinite collection of unit cells.

5. The method of claim 1, wherein in the determining a scattered electric field, the Green's function that is integrated with the determined single-cell contrast current density is obtained for observation points above the supporting domain with respect to a semiconductor substrate underlying the finite periodic structure.

6. The method of claim 1, wherein the electromagnetic scattering property comprises a diffraction pattern.

7. A method, for implementation in a lithography or metrology process, of reconstructing an approximate structure of a finite periodic structure on a target portion of a semiconductor substrate from a detected electromagnetic scattering property arising from illumination of the finite periodic structure by radiation, the method comprising:

estimating at least one structural parameter of the finite periodic structure on the target portion of the semiconductor substrate;

determining at least one model electromagnetic scattering property from the at least one structural parameter, the determining comprising:

determining a single-cell contrast current density within a unit-cell supporting domain of a single unit cell of the finite collection of unit cells;

determining a scattered electric field outside the finite collection of unit cells, arising from the finite periodic structure by integrating, over the single unit cell's supporting domain, a Green's function with the determined single-cell contrast current density, wherein the Green's function is obtained for observation points outside the finite collection of unit cells by summation across the finite collection of unit cells; and determining an electromagnetic scattering property of the finite periodic structure using the scattered electric field;

comparing the detected electromagnetic scattering property to the at least one model electromagnetic scattering property;

determining an approximate structure of the finite periodic structure based on the result of the comparison;

storing the determined electromagnetic scattering property for subsequent adjustment of parameter of the lithography or metrology process for the semiconductor substrate or another semiconductor substrate; and transmitting the determined electromagnetic scattering property to a lithographic apparatus or a metrology tool in order to adjust the parameter and improve accuracy of the lithographic apparatus or the metrology tool.

8. The method according to claim 7, further comprising:
arranging a plurality of the model electromagnetic scattering properties in a library; and
the comparing comprises matching the detected electromagnetic scattering property to contents of the library.

9. An inspection apparatus of a lithographic apparatus or a metrology tool, the inspection apparatus comprising:

an illumination system configured to illuminate a finite periodic structure on a target portion of a semiconductor substrate with radiation;

a detection system configured to detect an electromagnetic scattering property arising from the illumination of the finite periodic structure on the target portion of the semiconductor substrate; and a processor configured to:
estimate at least one structural parameter based on the detection;
determine at least one model electromagnetic scattering property from the at least one structural parameter, the determining comprising:
determining a single-cell contrast current density within a unit-cell supporting domain of a single unit cell of a finite collection of unit cells;
determining a scattered electric field outside the finite collection of unit cells, arising from the finite periodic structure by integrating, over the single unit cell's supporting domain, a Green's function with the determined single-cell contrast current density, wherein the Green's function is obtained for observation points outside the finite collection of unit cells by summation across the finite collection of unit cells; and
determining an electromagnetic scattering property of the finite periodic structure using the scattered electric field;
compare the detected electromagnetic scattering property to the at least one model electromagnetic scattering property;
determine an approximate structure of the finite periodic structure based on the result of the comparison;
store the determined electromagnetic scattering property for subsequent adjustment of a parameter of a lithography or metrology process for the semiconductor substrate or another semiconductor substrate; and
transmit the determined electromagnetic scattering property to the lithographic apparatus or the metrology tool in order to adjust the parameter and improve accuracy of the lithographic apparatus or the metrology tool.

10. A computer program product containing one or more sequences of machine-readable instructions for determining electromagnetic scattering properties of a finite periodic structure on a target portion of a semiconductor substrate, the instructions being adapted to cause one or more processors in a lithographic apparatus or a metrology tool to perform operations comprising:

determining a single-cell contrast current density within a unit-cell supporting domain of a single unit cell of a finite collection of unit cells;

determining a scattered electric field outside the finite collection of unit cells, arising from the finite periodic structure by integrating, over the single unit cell's supporting domain, a Green's function with the determined single-cell contrast current density, wherein the Green's function is obtained for observation points outside the finite collection of unit cells by summation across the finite collection of unit cells;

determining an electromagnetic scattering property of the finite periodic structure using the scattered electric field;

storing the determined electromagnetic scattering property for subsequent adjustment of a parameter of a lithography or metrology process for the semiconductor substrate or another semiconductor substrate; and transmitting the determined electromagnetic scattering property to the lithographic apparatus or the metrology tool in order to adjust the parameter and improve accuracy of the lithographic apparatus or the metrology tool.

* * * * *

UNITED STATES PATENT AND TRADEMARK OFFICE
CERTIFICATE OF CORRECTION

PATENT NO. : 10,948,409 B2
APPLICATION NO. : 15/644072
DATED : March 16, 2021
INVENTOR(S) : Setija et al.

Page 1 of 1

It is certified that error appears in the above-identified patent and that said Letters Patent is hereby corrected as shown below:

In the Claims

Claim 7, Column 24, Line 13, "subsequent adjustment of parameter" should be --subsequent adjustment of a parameter--.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*